(12) United States Patent  
Sieg et al.

(10) Patent No.: US 8,211,717 B1  
(45) Date of Patent: Jul. 3, 2012

(54) SEM REPAIR FOR SUB-OPTIMAL FEATURES

(75) Inventors: Stuart A. Sieg, Hopewell Junction, NY (US); Kourosh Nafisi, Hopwell Junction, NY (US); Eric Peter Solecky, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/013,947

(22) Filed: Jan. 26, 2011

(51) Int. Cl.
*H01L 21/66* (2006.01)

(52) U.S. Cl. . 438/14; 438/4; 257/E21.525; 257/E21.529

(58) Field of Classification Search .................... 438/14, 438/4; 257/E21.525, E21.529
See application file for complete search history.

(56) References Cited

U.S. PATENT DOCUMENTS

| | | | |
|---|---|---|---|
| 4,751,169 A | 6/1988 | Behringer et al. | |
| 7,002,165 B2 | 2/2006 | Lin | |
| 7,323,291 B2 * | 1/2008 | Sandstrom | 430/296 |
| 7,523,027 B2 | 4/2009 | Chang et al. | |
| 2003/0129508 A1 * | 7/2003 | Lin | 430/30 |
| 2004/0048398 A1 | 3/2004 | Liang et al. | |
| 2008/0054191 A1 | 3/2008 | Lin et al. | |
| 2010/0062182 A1 | 3/2010 | Arai et al. | |
| 2010/0119698 A1 | 5/2010 | Bihr et al. | |
| 2011/0163068 A1 * | 7/2011 | Utlaut et al. | 216/66 |

OTHER PUBLICATIONS

Ted Liang et al.; Demonstration of Damage-Free Mask Repair Using Electron Beam-induced Processes; Petra Spies Proceedings; vol. 5446, 291; 2004.
Christian Ehrlich et al.; Application data of the electron beam based photomask repair tool MeRiT MG; Proc. SPIE; vol. 5835, 145; 2005.
Keiko Morishita et al; A noble evaluation method for repaired area utilizing SEM images; Proc. SPIE; vol. 7379, 73792C; 2009.
Klaus Edinger et al; Application of Electron-beam Induced Processes to Mask Repair; Proc. SPIE; vol. 5130, 383; 2003.
Benjamin Bunday et al; Electron-beam induced photoresist shrinkage influence on 2-D profiles; Proc. SPIE; vol. 7638, 2010.

* cited by examiner

*Primary Examiner* — Julia Slutsker
(74) *Attorney, Agent, or Firm* — Joseph P. Abate; Howard M. Cohn

(57) ABSTRACT

A method and system for repairing photomasks is disclosed. A scanning electron microscope (SEM) is used to identify, measure, and correct defects. The SEM is operated in multiple modes, including a measuring mode and a repair mode. The repair mode is of higher landing energy and exposure time than the measuring mode, and induces shrinkage in the photoresist to correct various features, such as vias that are too small.

10 Claims, 4 Drawing Sheets

SEM REPAIR FOR SUB-OPTIMAL FEATURES

FIELD OF THE INVENTION

The present invention relates generally to semiconductor fabrication, and more particularly, to methods and systems for detecting and repairing defects during the semiconductor fabrication process.

BACKGROUND OF THE INVENTION

As the trend towards miniaturization of semiconductor devices continues, variation in lithographic features becomes increasingly more significant. Variation in the lithographic process can lead to features being undersized. These undersized features are randomly distributed throughout a wafer, and cause higher resistance, and thus, also may cause poor performance in the chip. Furthermore, such defects adversely impact the overall yield of the semiconductor fabrication process. Therefore, it is desirable to have a method and system for identifying and repairing defects during the semiconductor fabrication process.

SUMMARY OF THE INVENTION

In one embodiment of the present invention, a method of repairing a semiconductor feature is provided. The method comprises identifying a repairable defect in a photoresist layer, computing a size correction, and selecting a repair SEM configuration. Then, a repair zone is identified. The repair zone is exposed to a repair SEM that is configured with the repair SEM configuration.

In another embodiment of the present invention, a system for repairing a semiconductor feature is provided. The system comprises various subsystems, including an identification subsystem and a repair subsystem. The identification subsystem comprises an inspection SEM, and the repair subsystem comprises a repair SEM. The identification subsystem communicates defect data to the repair subsystem.

In another embodiment of the present invention, a system for repairing a semiconductor feature is provided. The system comprises an identification subsystem and a repair subsystem. The identification subsystem comprises an inspection SEM, and the repair subsystem comprises a repair SEM and a metrology SEM. The identification subsystem communicates defect data to the repair subsystem, and the metrology SEM measures the size of the feature. The repair subsystem configures the repair SEM to increase the feature size from the measured feature size to a design-specified feature size.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG).

FIG. 1 shows a block diagram of an embodiment of the present invention.

Figure 2A:
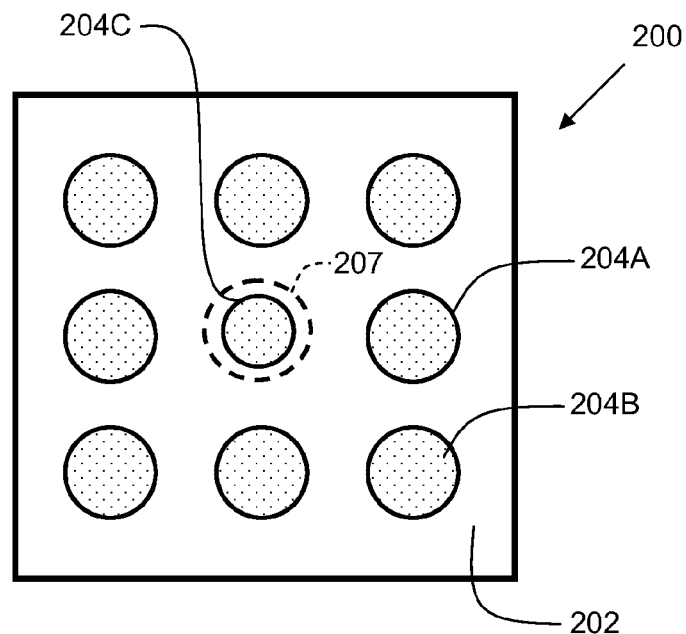
Figure 2B:
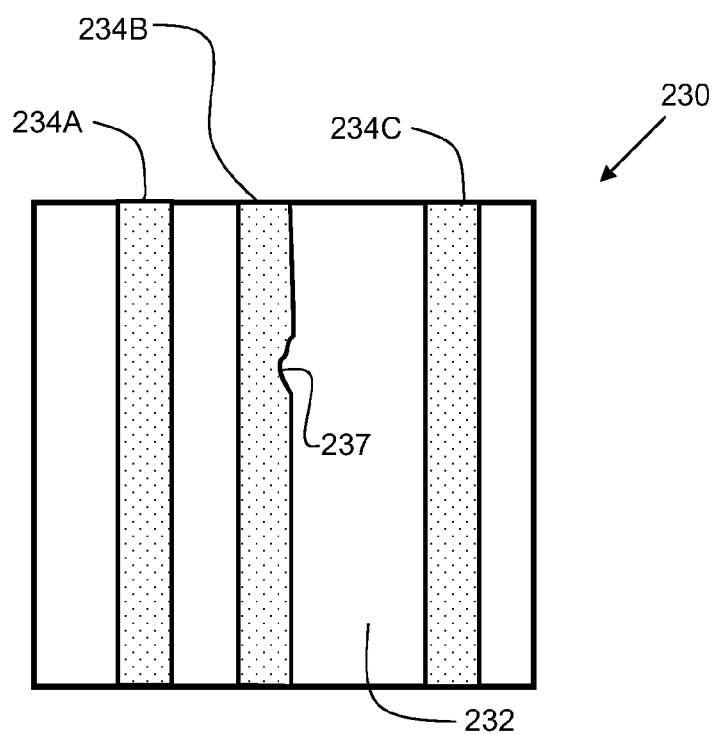
Figure 2C:
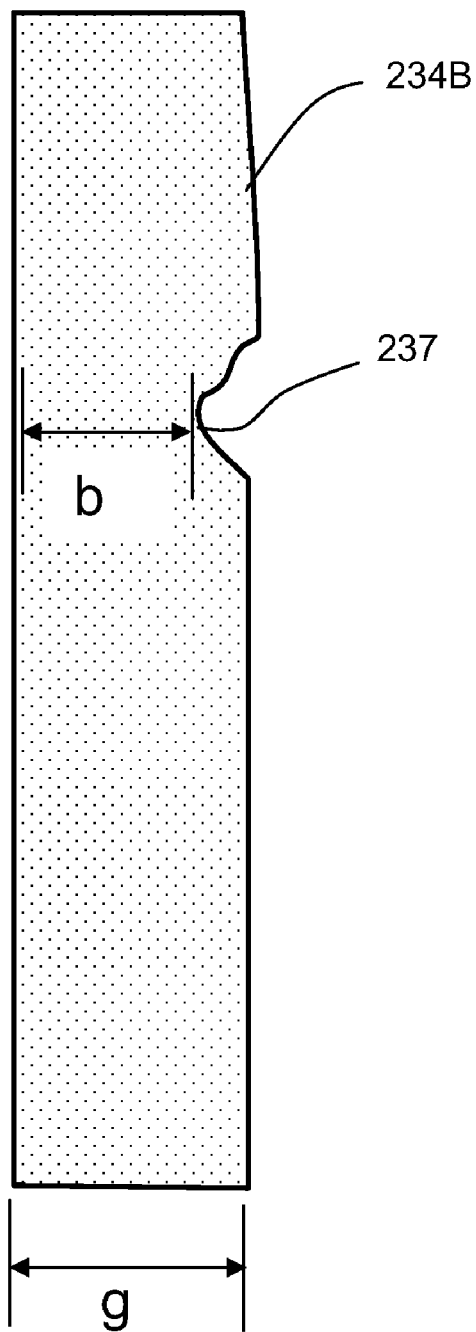

FIGS. 2A, 2B, and 2C show examples of defects that are repairable by an embodiment of the present invention.

Figure 3:
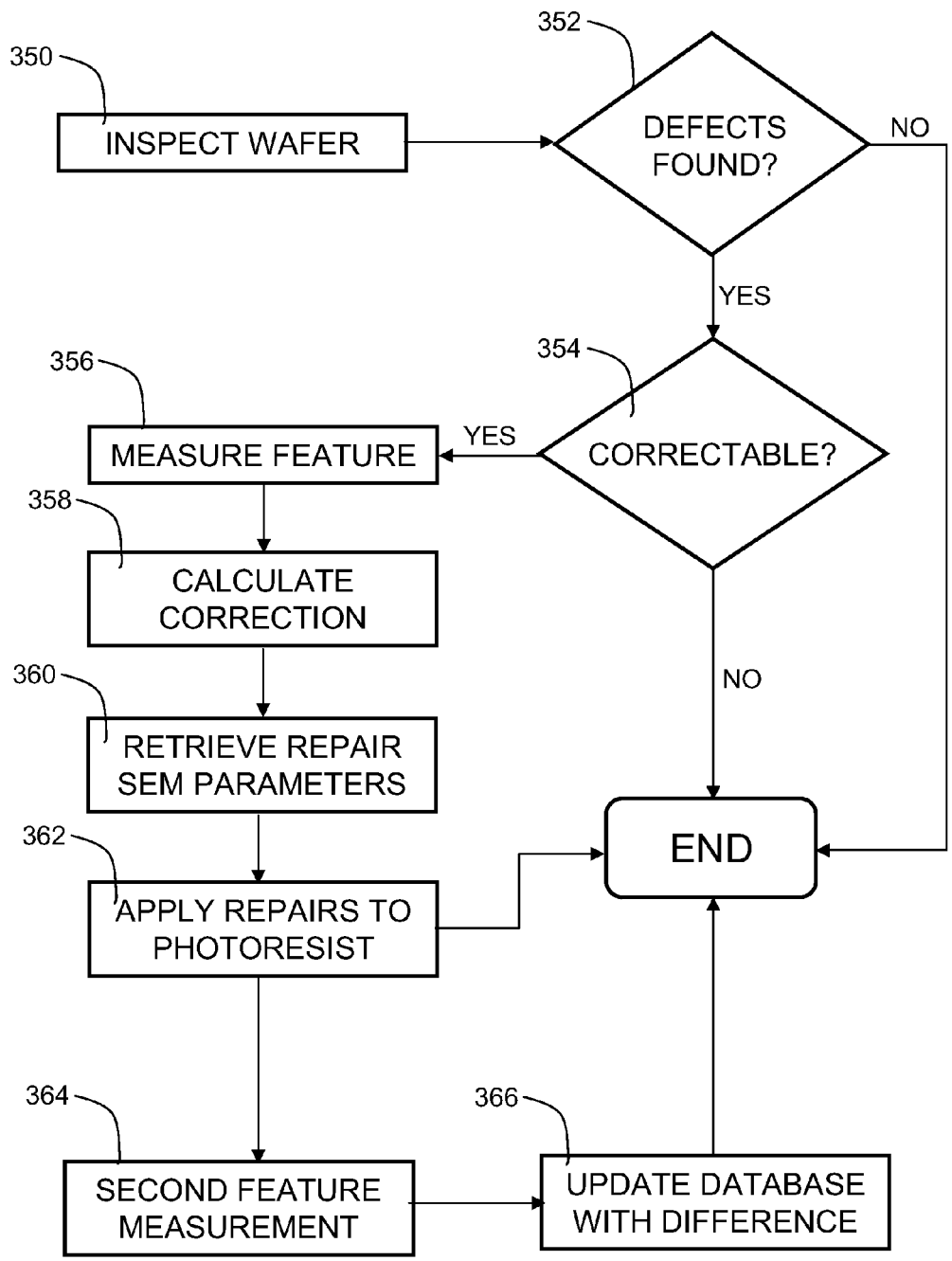

FIG. 3 is a flowchart indicating process steps for an embodiment of the present invention.

DETAILED DESCRIPTION

In general, the sooner a defect is identified in a semiconductor fabrication process, the quicker, and cheaper it is to remedy that defect. Embodiments of the present invention repair features in photoresist prior to the subsequent etch step. Hence, by repairing the photoresist, the resulting etch has fewer defects. This can be much more efficient than the common practice of "strip and re-pattern," where a wafer with such defects has its photoresist stripped and then reapplied. In embodiments of the present invention, the photoresist is not stripped from the wafer. Instead, targeted repairs are made to features that are outside of design specifications, saving time and expense.

A scanning electron microscope (SEM) is a tool used in the semiconductor industry for inspection of semiconductor features, such as via holes and lines. It operates by bombarding a semiconductor surface with electrons. The electrons reflect into a detector. The surface geometry and materials affect the amount of electrons reflected, and hence the amount of reflected electrons can be used to derive an image of the feature.

While a SEM is a useful tool for inspection, it also may have the effect of altering the photoresist material undergoing inspection. Some photoresists shrink when exposed to an electron beam. For example, photoresists with a wavelength of 193 nanometers or below generally shrink when exposed to a SEM. Such alteration is generally undesirable while in an inspection or measurement mode. However, the alteration property of the SEM is exploited by embodiments of the present invention during the repair process.

In particular, the repairable defects are cases where a feature (such as a via hole or line) is formed, but is too small, meaning that there is too much photoresist. Since the feature is defined by a void in the photoresist, excess photoresist makes the feature smaller. If the photoresist is shrunk, the feature size increases. A repairable defect is one where a feature is formed, but is too small, and is still within the correctable range. By intentionally shrinking photoresist near a feature that is too small, the size of a feature that is defective because it is too small can be increased.

In embodiments of the present invention, for repair, the SEM parameters are configured such that it operates in a repair mode instead of an inspection/measuring mode. The SEM parameters that are changed may include landing energy settings and exposure times. When in repair mode, the SEM can shrink a predetermined area of photoresist. By shrinking an area of photoresist near a void that is too small, the void (corresponding to a resultant semiconductor feature) is increased. By using the proper parameter values, certain voids that are too small can be changed to be within specification, hence repairing the defect at the photomask level. Had the defect gone un-repaired, the subsequent etch step would have produced a defective feature in the underlying substrate below the photomask.

Figure 1:
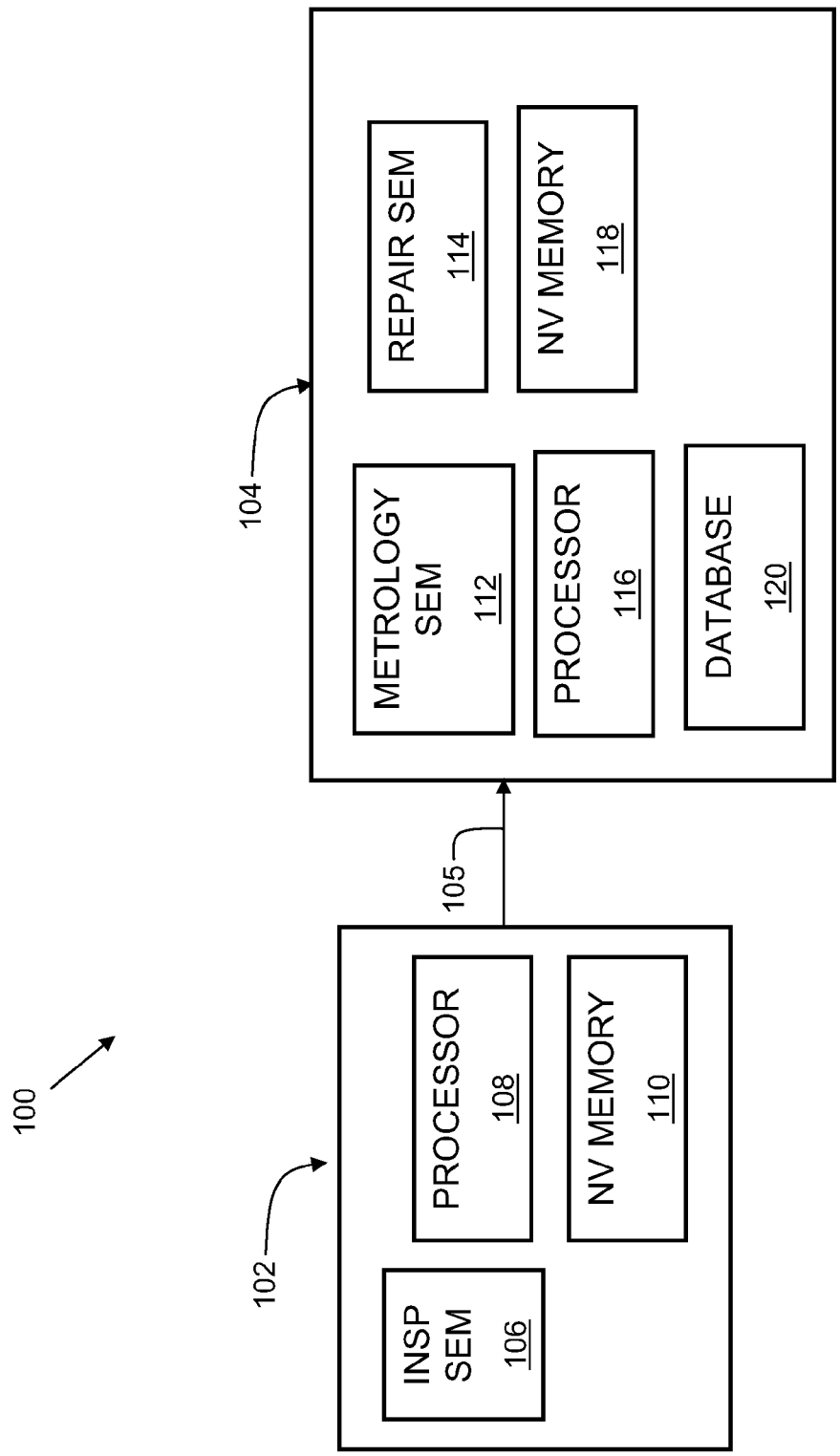

FIG. 1 shows a block diagram of a system 100 in accordance with an embodiment of the present invention. System 100 comprises identification subsystem 102 and repair subsystem 104. Subsystem 102 comprises inspection SEM 106. The inspection SEM encompasses a relatively large viewing area (on the order of about 10 nanometers to many micrometers).

The purpose of the inspection SEM is to inspect a wafer for defects, and in particular, to identify the subset of defects that are repairable by embodiments of the present invention.

Within subsystem 102 is a processor 108, which may be a microprocessor. Processor 108 accesses non-volatile memory 110 to retrieve machine-readable instructions, that when executed, identify repairable defects. This identification process may involve image comparison, where the images of the wafer undergoing inspection are compared with known good images (reference images). When a wafer is found to have a number of repairable defects, the wafer is then forwarded to repair subsystem 104. The identification subsystem 102 transmits coordinate data for each defect to the repair subsystem 104, via communication link 105.

Repair subsystem 104 comprises metrology SEM 112 and repair SEM 114. When a wafer arrives at repair subsystem 114, the metrology SEM 112 measures each defect to compute the amount of size correction that is needed to repair the defect. The identification subsystem 102 provides a high-level inspection of the wafer and identifies potential correctable defects. The metrology SEM performs a close-up inspection of each defect to ascertain the specific amount of size correction needed. Processor 116 is in communication with non-volatile memory 118 and accesses machine-readable instructions to control the operation of the metrology SEM 112, repair SEM 114, and access repair database 120.

Once the metrology SEM 112 is used to measure a defective feature in the photoresist, the amount of correction required (e.g. how much larger, in angstroms, the feature needs to be in order to be within design specification), and the type and depth of the material (e.g. specifics of the type and depth of the photoresist) are compared with known samples in database 120. Database 120 contains records of various corrections applied under certain conditions. For example, each record within database 120 may include, but is not limited to, the depth of the photoresist, the amount that the void needs to be increased to correct the defect, the recommended landing energy setting for the SEM, and the recommended exposure time for the SEM, and the recommended repair zone (area surrounding the defect that needs to be exposed by the repair SEM). The SEM software allows the user to very precisely define the exposure location in order to correct the defect. The exposure location is preferably at, or close to, the defect area.

Preferably, the metrology SEM 112, and inspection SEM 106 are operated at the lowest possible beam conditions (e.g. landing energy and exposure time), as to minimize alteration of the photoresist during inspection. For the repair SEM 114, the repair SEM configuration, which comprises the landing energy and exposure settings, is retrieved from the database 120. Repair SEM 114 is then used to shrink the photoresist the needed amount to correct the defect. In this case, embodiments of the present invention intentionally exploit an effect that is normally considered as undesirable for the purposes of repairing the photoresist.

The entries in database 120 may be derived from empirical experimentation. These entries are referred to as empirical repair SEM configurations. The repair SEM is set with the appropriate repair SEM configuration to cause intentional shrinking of the photoresist. The shrunk photoresist is then measured to correlate the amount of shrinkage with the SEM settings (landing energy and exposure time). This data is then stored in the database 120 during a calibration setup of system 100.

FIG. 2A and FIG. 2B show examples of defects that are repairable by an embodiment of the present invention. FIG. 2A shows a top-down view of semiconductor structure 200. Photoresist layer 202 has a plurality of "features", which are voids within the photoresist. Void 204A and void 204B are examples of properly sized voids. In comparison, void 204C is smaller than the other voids, due to a lithography error. The small void will result in a smaller etched feature (e.g. a via hole), and thus, can lead to higher resistance, causing unwanted device variability. A repair zone is the area of photoresist that is to be exposed by the repair SEM in order to cause the shrinkage in the photoresist needed to repair the feature. By applying the repair SEM 114 to repair zone 207, photoresist within the repair zone shrinks, thereby restoring void 204C to be within design specifications in terms of its diameter.

FIG. 2B shows a top-down view of semiconductor structure 230. Photoresist layer 232 has a plurality of lines, 234A, 234B, and 234C, which are voids in the photoresist layer 232. Lines 234A-234C may be used in the formation of metal or polysilicon lines in a semiconductor. Line 234B has lithography defect 237, where the line 234B is narrower than it is supposed to be, which will cause a narrower line, which causes undesirably increased resistance.

FIG. 2C shows detail of line 234B of FIG. 2. The design-specified width of line 234B is indicated as g. However, at the site of the lithography defect 237, the measured width of line 234B is b, where b is less than g, but still correctable, meaning that g−b is greater than a predetermined value representing the maximum correctable size. For example, suppose that g=200 angstroms, b=150 angstroms, and the maximum correctable size M is 60 angstroms. Then the condition: (g−b<M) AND (g−b>0) is satisfied. Therefore, this is a repairable defect, and is routed to the repair subsystem 104 for repair by repair SEM 114. In one embodiment, the value of M is in the range of 40 angstroms to 100 angstroms.

Note that the condition that g−b is greater than zero implies that features can be enlarged by embodiments of the present invention, but are not reduced. Hence if (g−b>0) is not satisfied, it implies that the feature is too big, and hence, is not considered as a repairable defect. However, in another embodiment, it is contemplated that a second predetermined value is used to act as a minimum size error needed in order to classify the feature as defective. For example, if a measured feature is less than 5 angstroms outside of the design-specified size, then it may not be repaired, as the adverse effects may not be worth the time to repair it. Hence, in a generalized form, the equation: (g−b<M) AND (g−b>N) is satisfied, where N is the minimum size difference needed to classify a defect as repairable. In one embodiment, N ranges from 5 angstroms to 15 angstroms.

FIG. 3 is a flowchart 300 indicating process steps for an embodiment of the present invention. In process step 350, a semiconductor wafer is inspected. This is done via the inspection SEM 106 (see FIG. 1). In process step 352, the wafer is checked for defects. In one embodiment, processor 108 evaluates images from inspection SEM 106, and uses image recognition techniques to identify possible defects. In process step 354, processor 108 then classifies repairable defects as those resulting from a feature size (void in silicon) that is too small, but still within correctable limits. The correctable limits depend on the photoresist material and the critical dimension (CD) of the technology. In one embodiment, the correctable limit is about 100 angstroms. If the identification subsystem 102 determines that there are correctable defects, the wafer is then routed to repair subsystem 104.

In process step 356, each correctable defect is measured by metrology SEM 112 (see FIG. 1). The metrology SEM performs a detailed measurement of the feature (void) to determine how much correction is required. The metrology SEM is preferably of low power and exposure time as so not to alter the photoresist material. In process step 358, the measured feature size is compared against a corresponding design-specified feature size, and a difference is computed. For example, if the designed diameter of a void in the photomask (e.g. 204A of FIG. 2) is 40 nanometers, and the measured diameter of the defective void (e.g. 204C of FIG. 2A) is 37 nanometers, then a correction of 3 nanometers (30 angstroms) is needed to correct the defective void. Once the defect location and amount of correction is determined, the SEM is then programmed to scan the area requiring correction at the needed landing energy and exposure while minimally impacting the surrounding areas.

In process step 360, the repair SEM parameters are retrieved from database 120 (FIG. 1). Processor 116 queries database 120 to find the closest matching "recipe" to conduct the necessary shrinkage of photoresist. Data stored in the database 120 may include, but is not limited to, the power setting for repair SEM 114, the exposure time for SEM 114, and the location and area of the repair zone (area of photomask to be targeted by repair SEM 114 to induce the photoresist shrinkage). In process step 362, the repair is applied to the photoresist by setting the repair SEM 114 with the recipe parameters retrieved from database 120. In one embodiment, the SEM settings used are: 800 eV for landing energy, 50 pV for probe current, 32 frame at 3×TV scan rate for exposure, and a 1 nanometer pixel size.

Optionally, process steps 364 and 366 may be performed to apply feedback to database 120. In an embodiment using these process steps, after a feature is repaired in step 362, a second feature measurement is performed in step 364 using the metrology SEM 112 (FIG. 1). The difference between the measurements (e.g. diameter) of the repaired void and the designed value is noted, and in process step 366 this information is added to the database 120.

In some cases, the desired correction may not correlate directly to a database entry. In such a case, embodiments of the present invention may perform a calculation such as interpolation between neighboring data points, or a least squares fit to a plurality of data points to determine a computed repair SEM configuration. For example, if it is desired to enlarge a void diameter by 17 angstroms, but there are only data points for a 15 angstrom correction and a 20 angstrom correction, then processor 116 in the repair subsystem 104 may interpolate between the 15 angstrom data point and the 20 angstrom data point to derive the parameters for a 17 angstrom correction. Optionally, after the repair is made, the repaired feature is measured, and the actual amount of shrinkage, along with the power settings of the SEM, is entered into database 120. Thus, as the repair tool continues to be used more data points can be added to database 120 provide better data for selecting repair settings.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of repairing a semiconductor feature, comprising:
   identifying a repairable defect in a photoresist layer that is disposed on a semiconductor substrate;
   computing a size correction for the repairable defect;
   selecting a repair SEM configuration corresponding to the size correction; and
   exposing the repairable defect to a repair SEM configured with the repair SEM configuration; and
   wherein selecting a repair SEM configuration comprises:
   searching a database of empirical repair SEM configurations; and
   selecting an empirical repair SEM configuration within the database having a size correction that most closely matches the computed size correction.

2. The method of claim 1, wherein identifying a repairable defect in a photoresist layer comprises:
   measuring the size of a defect;
   comparing the measured size of the defect to a design-specified size for a corresponding feature; and
   classifying the defect as repairable if the difference between the design-specified size and measured size is less than a first predetermined value.

3. The method of claim 2, wherein classifying the defect as repairable further comprises verifying that the design-specified size is greater than the measured size.

4. The method of claim 2, wherein classifying the defect as repairable further comprises verifying that design-specified size is greater than the sum of the measured size and a second predetermined value.

5. The method of claim 2, wherein the first predetermined value is in the range of about 50 angstroms to 90 angstroms.

6. The method of claim 4, wherein the second predetermined value is in the range of about 6 angstroms to 14 angstroms.

7. The method of claim 1, wherein identifying a repairable defect in a photoresist layer comprising identifying a via hole having a diameter smaller than a design-specified diameter.

8. The method of claim 1, wherein identifying a repairable defect in a photoresist layer comprising identifying a line having a width at least one point that is smaller than a design-specified width.

9. A method of repairing a semiconductor feature, comprising:
   identifying a repairable defect in a photoresist layer that is disposed on a semiconductor substrate;
   computing a size correction for the repairable defect;
   selecting a repair SEM configuration corresponding to the size correction; and
   exposing the repairable defect to a repair SEM configured with the repair SEM configuration; and
   wherein selecting a repair SEM configuration comprises:
   searching a database of empirical repair SEM configurations;
   selecting a first empirical repair SEM configuration having a size correction that is closest to, and less than, the computed size correction;
   selecting a second empirical repair SEM configuration having a size correction that is closest to, and greater than, the computed size correction; and
   interpolating between the first empirical repair SEM configuration and the second empirical repair SEM configuration to derive an interpolated SEM configuration.

10. A method of repairing a semiconductor feature, comprising:
    identifying a repairable defect in a photoresist layer that is disposed on a semiconductor substrate;
    computing a size correction for the repairable defect;
    selecting a repair SEM configuration corresponding to the size correction; and
    exposing the repairable defect to a repair SEM configured with the repair SEM configuration; and
    wherein selecting a repair SEM configuration comprises:
    performing a least squares fit on a plurality of empirical repair SEM configurations to determine a computed repair SEM configuration.

* * * * *